(12) United States Patent
Yamagishi

(10) Patent No.: US 6,638,091 B2
(45) Date of Patent: Oct. 28, 2003

(54) SOCKET FOR ELECTRICAL PARTS

(75) Inventor: Hiroki Yamagishi, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 10/060,237

(22) Filed: Feb. 1, 2002

(65) Prior Publication Data

US 2002/0106925 A1 Aug. 8, 2002

(30) Foreign Application Priority Data

Feb. 2, 2001 (JP) ......................................... 2001-026534

(51) Int. Cl.[7] ............................................... H01R 13/62
(52) U.S. Cl. ....................................... 439/331; 439/342
(58) Field of Search ................................. 439/331, 330, 439/342

(56) References Cited

U.S. PATENT DOCUMENTS 6,368,137 B1 * 4/2002 Orwoll ........................ 439/331

* cited by examiner

*Primary Examiner*—Renee Luebke
*Assistant Examiner*—Ann McCamey
(74) *Attorney, Agent, or Firm*—Staas & Halsey LLP

(57) ABSTRACT

A socket for an electrical part comprises an open/close member mounted, to be rotatable about a rotational shaft, to a socket body in which an electrical part is accommodated, an urging member for urging the open/close member in a closed direction thereof, and an operation member vertically movable with respect to the socket body. The open/close member is opened against the urging force of the urging member by depressing the operation member the urging member has one end portion engaged with a portion of the open/close member apart from a rotation center thereof and another end portion engaged with the operation member.

14 Claims, 6 Drawing Sheets

PRIOR ART

PRIOR ART

SOCKET FOR ELECTRICAL PARTS

BACKGROUND OF THE INVENTION

1. Field of The Invention

The present invention relates to a socket for electrical parts for detachably accommodating an electrical part such as a semiconductor device (called as "IC package" hereinafter), and more particularly, to a socket for electrical parts having a structure for effectively acting an urging force of an urging member for urging an open/close member in a direction pressing it against an IC package body.

2. Related Art

As a "socket for electrical parts" of this kind, there is provided an IC socket for detachably accommodating an IC package as "electrical part", and one example having such structure is shown in FIGS. 6 to 8.

FIG. 6 is a plan view of such IC socket including an upper half portion in which an open/close member is opened and a lower half portion in which the open/close member is closed. FIG. 7 is a sectional view taken along the line VII—VII in FIG. 6, showing the closed state of the open/close member, and FIG. 8 is also a sectional view taken along the line VIII—VIII in FIG. 6 showing the opened state of the open/close member.

In a case where a performance test of an IC package is carried out by using this IC socket, as shown in FIGS. 6 to 8, an open/close member 41 having a heat sink 40 is mounted to a socket body 42, to be rotatable (pivotal) about a rotational shaft 43, so as to press downward the IC package body and to remove heat generated in the IC package. The IC package 50 is then rested on a mount surface portion 45 of an IC socket 44, and thereafter, the heat sink 40 is disposed so as to abut against an upper surface of the IC package 50 to thereby press the body portion of the IC package 50 with a predetermined pressure and carry out the heat radiation during.this process.

A torsion coil spring 46 as a member for urging the open/close member 41 in a direction of closing the same is arranged between the socket body 42 and the open/close member 41 having the heat sink 40. More specifically, the torsion coil spring 46 has a rod-like portion 46a, and a front end portion of the rod-like portion 46a is engaged with an end portion of the open/close member 41 positioned apart from the rotational shaft 43 of the open/close member 41, a coil (coiled) portion 46b of the torsion coil spring 46 is wound up around the rotational shaft 43, and the end portion 46c of the coil portion 46b is engaged with the rotational shaft 43 so as not to be rotated, thereby urging the open/close member 41 in its closing direction.

Further, in a case where the open/close member 41 is opened for mounting the IC package 50, the end side of the open/close member 41 is opened against the urging force of the torsion coil spring 46 about the rotational shafts 43 as shown in FIG. 8.

In the IC socket 44 of the structure mentioned above, the rod-like portion 46a of the torsion coil spring 46 is rotated by the same angle θ1 (displacement amount) of the open/close member 41 according to the opening movement of the open/close member, as shown in FIG. 7.

On the other hand, in order to ensure a contact pressure sufficient for contacting the heat sink 40 against the IC package body, it will be done to increase the winding number of the coil portion 46b of the torsion coil spring 46 or to make large the coil portion in average diameter.

However, increasing of the urging force of the torsion coil spring 46 by increasing the winding number or making large the average diameter of the coil windings results in increasing of a force required for opening the open/close member 41 and, hence, increasing of a space for arranging the torsion coil spring 46, and moreover, because of the rotation angle θ1 (displacement) of the rod-like portion 46a of the torsion coil spring 46, the operational durability of the torsion coil spring 46 will be made worse.

SUMMARY OF THE INVENTION

An object of the present invention is to substantially eliminate defect or drawbacks encountered in the related art mentioned above and to provide a socket for electrical parts capable of, while maintaining a predetermined contact pressure contacting an open/close member against a body of an electrical part such as IC package, reducing a force for opening the open/close member by reducing an urging force of an urging member that generates such contact pressure, making compact the entire structure of the socket and improving an operational durability thereof.

This and other objects can be achieved according to the present invention by providing, in one aspect, a socket for an electrical part which comprises an open/close member mounted, to be rotatable about a rotational shaft, to a socket body in which an electrical part is accommodated, an urging member for urging the open/close member in a closed direction thereof, and an operation member vertically movable with respect to the socket body and in which the open/close member is opened against the urging force of the urging member by depressing the operation member, wherein one end portion of the urging member is engaged with a portion of the open/close member apart from a rotation center thereof and another end portion of the urging member is engaged with the operation member.

According to this aspect of the invention, in accordance with the depressing motion of the operation member, the other end portion of the urging member is also lowered and escapes. Moreover, even if another urging member having an urging force weak in amount corresponding to the escaping amount be used, while a pressure contacting the heat sink to the IC package is maintained at a predetermined value, the urging force of the urging member generating such contacting pressure can be made weak to thereby reduce the opening force to the open/close member. Furthermore, the entire structure of the socket for electrical parts can be made compact in size. The operational performance and durability thereof can be also improved.

According to the preferred embodiment of the present invention, the urging member is a torsion coil spring having a coil portion, the one end portion extending from the coil portion and being engaged with that portion of the open/close member, and the another end portion extending from the coil portion, the coil portion being wound up around the rotational shaft.

The operation member is formed with an engagement portion with which the another end portion of the urging member is engaged and an escape portion, in which the another end portion is rotated according to lowering motion of the operation member, is formed to the operation member outside the engagement portion.

An auxiliary urging member for urging upward the operation member is disposed between the socket body and the operation member.

The open/close member is provided with a heat sink radiating a heat through contact to the electrical part. The heat sink is provided with an urging force adjusting device for urging the heat sink in a direction contacting to the electrical part. The urging force adjusting device includes a plurality of urging force adjusting members which are disposed apart from each other.

According to the structures of the above preferred embodiment, there acts a force for rotating the open/close member in its closing direction by means of the torsion coil spring with the contact portion between the inside portion of the coil portion of the torsion coil spring and the rotational shaft being fulcrum, and hence, the pressure for pressing the heat sink against the electrical part can be increased.

Furthermore, according to the formation of the escape portion, the other end portion of the urging member is guided to this escape portion by rotating at a predetermined degree of angles, so that the open/close member can be fully opened with a reduced rotation angle of the urging member. Thus, substantially the same urging force as that in the structure in which the other end is fixed can be achieved by using the urging member having a compact size and structure.

Still furthermore, the provision of the auxiliary urging member can apply an additional urging force to the urging member directly urging the open/close member in its closing direction. Accordingly, the pressing force for contacting the open/close member against the electrical part of such as IC package can be adjusted to thereby improve the heat radiation performance of the electrical part.

In addition, the location of the heat sink to the portion contacting the upper surface of the electrical part can avoid abnormal increasing of temperature of the electrical part and the performance test thereof can be precisely carried out. The location of the urging force adjusting member to the heat sink can achieve the adjustment of the contact pressure pressing the heat sink to the electrical part such as IC package, and hence, the heat radiation of the electrical part can be improved.

Further, the location of the plural urging force adjusting members can also achieve the adjustment of the contact pressure of the heat sink, and accordingly, the heat sink can be surely closely contacted to the IC package even having a relatively large size, thus improving the heat radiation of the IC package.

The above mentioned objects of the present invention will be also achieved by providing a socket for an electrical part of the another aspect having more specific structure. That is, there is provided, in a modified aspect, a socket for an electrical part comprising:

a socket body to which an electrical part is accommodated;

an open/close member mounted to the socket body to be rotatable about a rotational shaft;

an urging member for urging the open/close member in a direction of closing the open/close member; and an operation member provided for the socket body to be vertically movable with respect to the socket body, the urging member having one end portion engaged with a portion of the open/close member apart from a rotation center thereof and another end portion engaged with the operation member.

The nature and further characteristic features of the present invention will be made more clear from the following descriptions made with reference to the accompanying drawings.

DESCRIPTION OF THE PREFERRED EMBODIMENT

One preferred embodiment of an IC socket according to the present invention will be described hereunder with reference to FIGS. 1 to 5 of the accompanying drawings.

With reference to these FIGS. 1 to 5, an IC socket 1 for carrying out a performance test of an IC package 50 is provided with a socket body 2 which is mounted to a printed circuit board P, and a number of contact pins 3, which contact pin-shaped terminals, not shown, of the IC package 50, are arranged.

Figure 3:
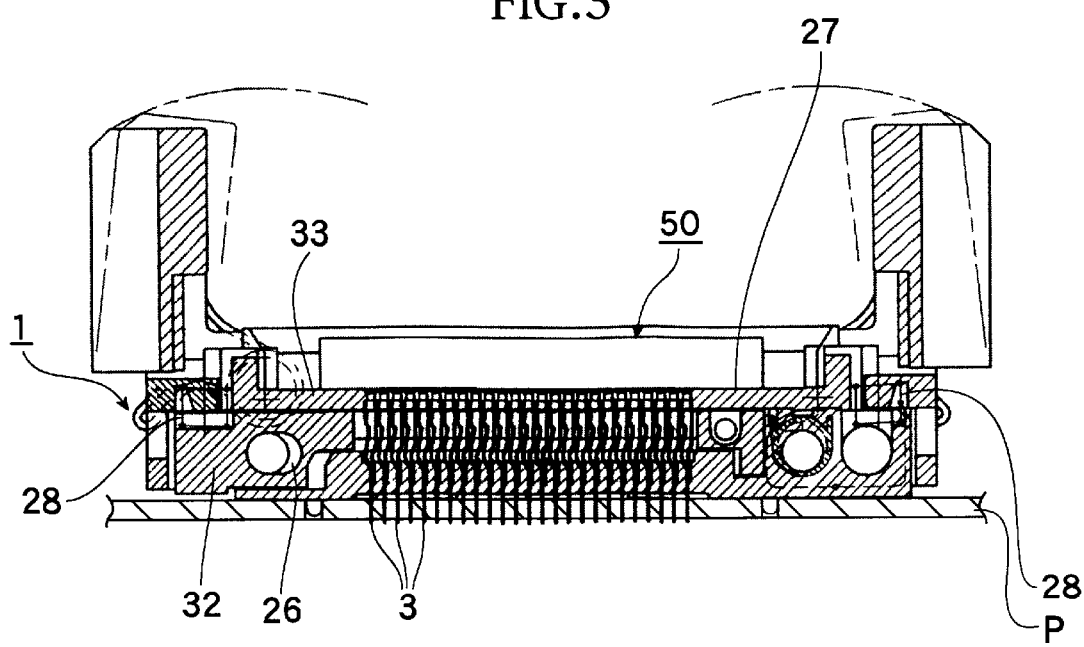
FIG. 3 is a sectional view taken along the line III—III of FIG. 1, showing the opened state of the open/close member.

This socket body 2 is provided with a movable plate 32 to be horizontally or transversely slidable, and the movable plate 32 acts to elastically deform the contact pins 3. A top plate 33 fixed to the socket body 2 is disposed on the upper side of this movable plate 32. The IC package 50 is placed on this top plate 33 and then accommodated in the socket body 2 as shown in FIG. 3.

Furthermore, a pair of open/close members 4, 4 for pressing the IC package 50 are secured to the socket body 2 to be opened or closed in both sides (so-called, biparting structure). An operation member 18 for opening or closing the open/close members 4, 4 and slidably move the movable plate 32 is also arranged to the socket body to be vertically movable.

The open/close members 4, 4 are composed of a pair of opposing pivotal arms 7, 7 and a flat (plane) portion 8 disposed so as to connect upper portions of these pivotal arms 7, 7 so as to provide approximately a gate-shape. The pivotal arms 7, 7 are rotatably disposed to the socket body 2 by means of rotational shafts or pins 5, 5 and urged in the closing direction by torsion coil springs 17 as urging members.

A heat sink 9 is also arranged to the flat portion 8 of each of the open/close members 4, 4. The heat sink 9 is formed through a die-casting of aluminum providing a good heat conductivity.

The heat sink 9 is mounted to the socket body 2 through an engagement of a male screw portion, not shown, formed to the flat portion 8 of the open/close member 4 with a female screw portion 11 of a set-screw 10 of the heat sink 9, and by removing a radiating fin 12 of the heat sink 9 at a portion corresponding to a portion with which the set-screw 10 is engaged, a seating portion 13 of an urging force adjusting member 16, described hereinlater, is formed. The set-screw 10 is formed with a shank portion 14 continuous to the male screw portion 11 to thereby form a head flange portion 15, and a height from the front end of the male screw 11 to the head flange portion 15 of the set-screw 10 is made to be substantially equal to the height of the radiating fin 12 of the heat sink 9.

Furthermore, when the heat sink 9 is attached to the open/close member 4, the urging force adjusting member 16 for urging the heat sink 9 on the side of the flat portion 8 is disposed between the seating 13 and the head flange 15. According to this arrangement, the urging force of this adjusting member 16 is adjusted and, hence, the contacting pressure of the heat sink 9 against the IC package body can be adjusted.

In this embodiment, although at least one set-screw 10 is required, it may be possible to use a plurality of set-screws. In the use of a plurality of set-screws 10, it may be desired to mount the urging force adjusting members 16 to all the set-screws 10 in an offset arrangement on the entire surface of the heat sink 9. In such arrangement, since the contacting pressure of the heat sink 9 against the body of the IC package 50 can be adjusted by the plural urging force adjusting members 16, the heat sink 9 having a relatively large size can be also entirely closely contacted, thus the heat radiation efficiency being improved.

On the other hand, the operation member 18 is formed with an opening 18a having a size capable of inserting the IC package 50 thereinto, and the IC package 50 inserted through this opening 18a is placed on a predetermined position on a mount surface portion 27 of the socket body 2. The operation member 18 is disposed to be vertically movable with respect to the socket body 2 and urged upward by means of an auxiliary spring 28. The operation member 18 is also formed with an operating projection (protruded portion) 18b allowing a pair of open/close members 4, 4 to rotate the paired open/close members 4, 4 through the engagement with engagement portions (portions to be engaged) 7a formed to the pivotal arms 7.

Torsion coil springs 17 urging the open/close members 4 in the closing direction are disposed between the operation member 18 and the open/close members 4, respectively.

The torsion coil spring 17 is mounted so that a coil portion 17b of the coil spring 17 is idly fitted so as to surround the rotational shaft 5 arranged to the socket body 2. A long-scaled rod-like portion 17a as "one end" extending in one direction from the coil portion 17b is engaged with an engagement portion (portion to be engaged) 7c of the front end of the pivotal arm 7.

Furthermore, on the other hand, a short-scaled rod-like portion 17c as "another end" extending in an another direction from the coil portion 17b is engaged with an engagement projection 29 as engagement portion formed to each of upper four corner portions of the operation member 18. This engagement projection 29 is formed with an escape portion 30 in which the short-scaled portion 17c of the torsion coil spring 17 can be rotated in accordance with the lowering motion of the operation member 18 when it is depressed downward.

Figure 4:
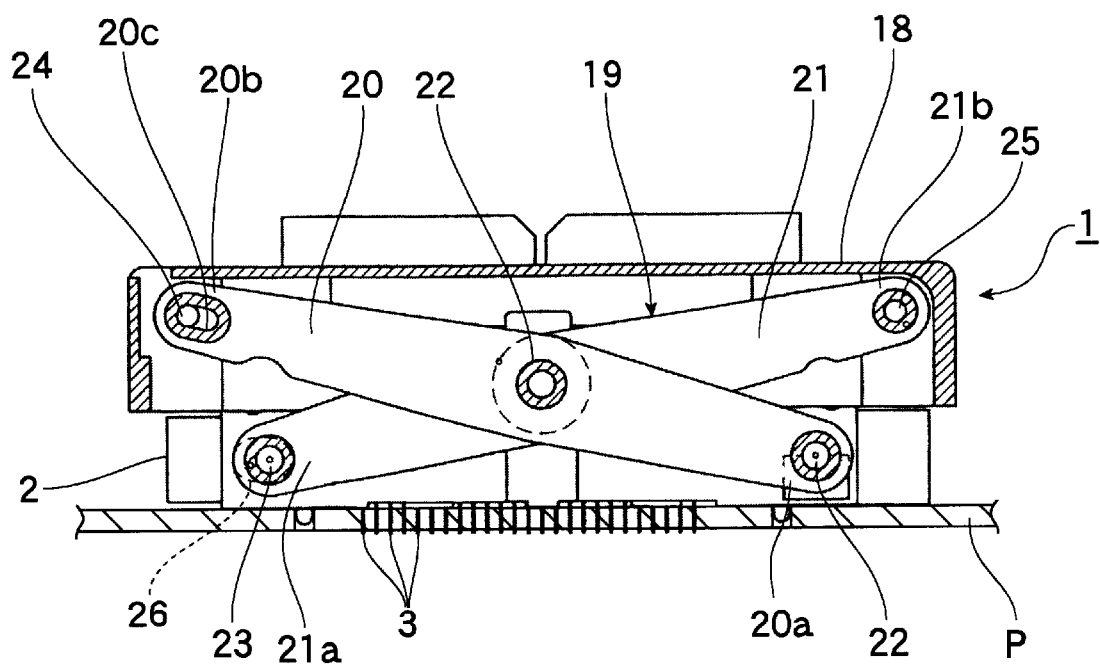
FIG. 4 is a sectional view of an essential portion of an X-shaped link of this embodiment, taken along the line IV—IV of FIG. 1.

Further, as shown in FIG. 4, an X-shaped link 19 is provided for the socket body 2 so as to slide the movable plate 32 in accordance with the vertical motion of the operation member 18.

The X-shaped link 19 is disposed to each of two opposing side portions of the socket body 2, and more specifically, as shown in FIG. 4, the X-shaped link 19 comprises first and second link members 20 and 21 having almost same length, which are connected to each other at their central portions by a central connection pin 22 to be rotatable.

The first link member 20 has a lower end 20a, as viewed, is connected, to be rotatable, to one end at a corner portion of the socket body 2 through the lower end connection pin 22, and on the other hand, the second link member 21 has a lower end 21a, as viewed, is connected, to be rotatable, to another one end at a corner portion of the socket body 2 through the lower end connection pin 23. Further, upper ends 20b and 21b of the first and second link members 20 and 21 are connected respectively to the operation member 18 by means of upper end connection pins 24 and 25 in the rotatable manner.

The upper end 20b of the first link member 20 is formed with a slot 20c extending in an axial direction thereof, through which the first link member 20 is connected to the operation member 18 by the upper end connection pin 24. On the other hand, the lower end connection pin 23 attached to the lower end 21a of the second link member 21 is engaged with a slot 26 formed to another end of the corner portion of the socket body 2 so as to extend in parallel to the horizontal direction so that the lower end connection pin 23 can be slid therein.

The IC socket of the structures mentioned above will operate in the following manner at a time of use.

Figure 1:
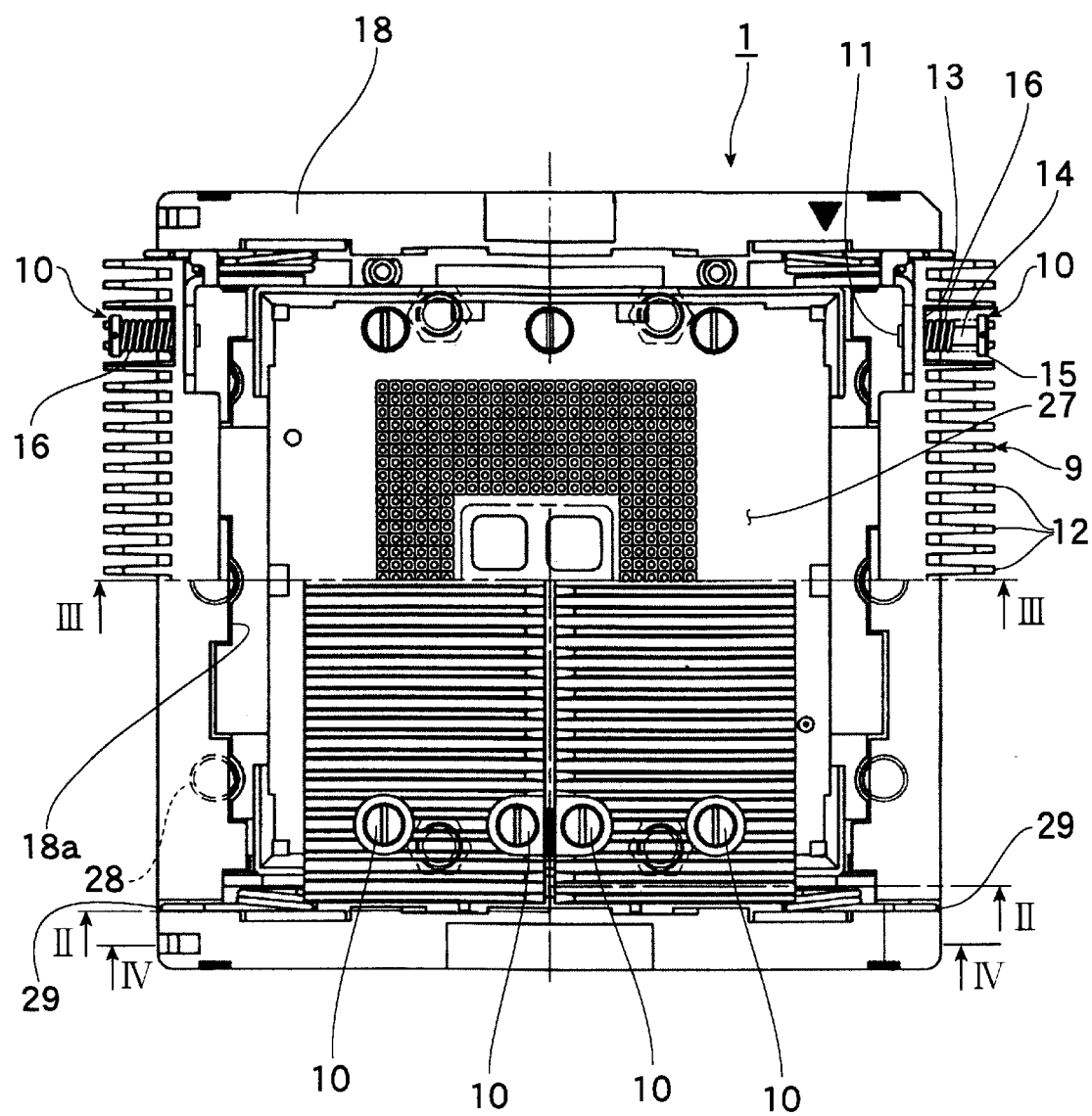
FIG. 1 is a plan view of an IC socket according to one embodiment of the present invention, in which an upper half shows a state that an open/close member is opened and a lower half shows that the open/close member is closed.
Figure 2:
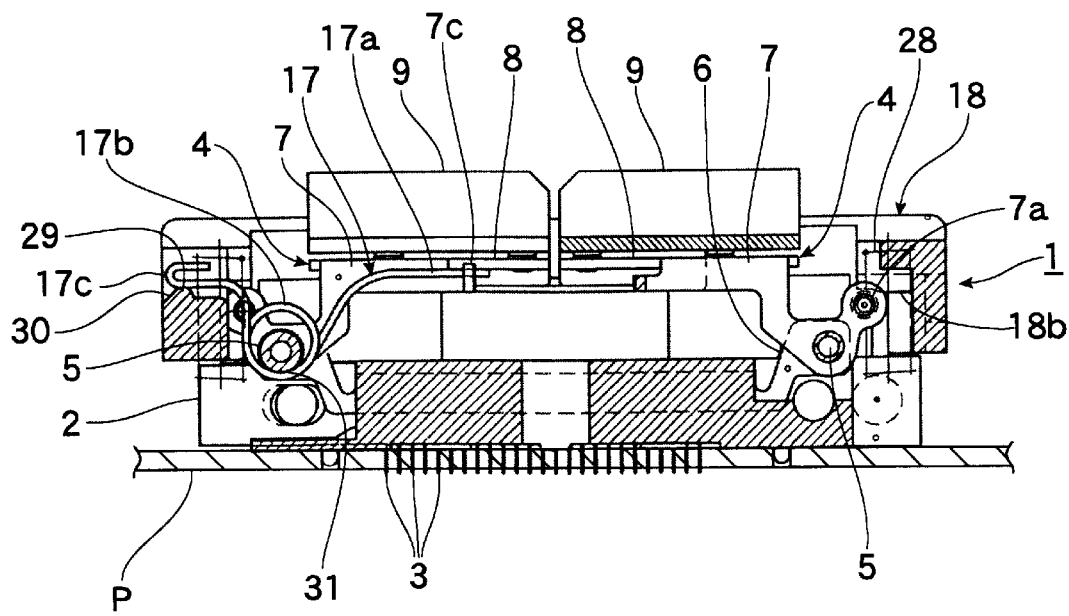
FIG. 2 is a sectional view taken along the line II—II in FIG. 1, showing the closed state of the open/close member.

When it is required to set the IC package 50 to the IC socket 1, the operation member 18 is first depressed in a state, for example, shown in FIG. 2. Then, the first and second link members 20 and 21 of the X-shaped link 19 are deformed so as to be folded about the center connection pin 22. In this operation, the operation member 18 is lowered while maintaining its horizontal attitude with respect to the socket body 2 by the action of the X-shaped links 19 each provided for each of two opposing side portions of the socket body 2.

Furthermore, at the time of depressing the operation member 18, the operating projections 18b formed to the four corner portions of the operation member 18 contact the press portions 7a of the pivotal arms 7 and then depress the press portions 7a. As a result, the pivotal arms 7 are rotated about the rotational shafts 5 of the arms 7, and thereby, the open/close members 4 are opened against the urging force of the torsion coil springs 17.

Figure 5A:
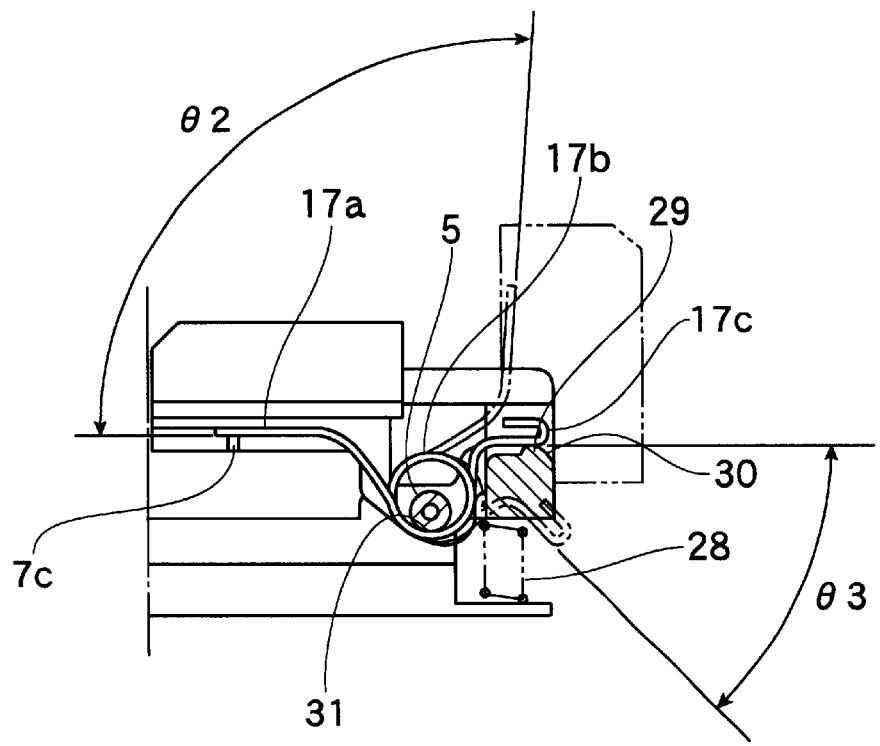
FIG. 5 is an explanation view of an operation of an urging member of the present embodiment, and includes FIG. 5A showing the closed state of the open/close member and FIG. 5B showing the opened state thereof.
Figure 5B:
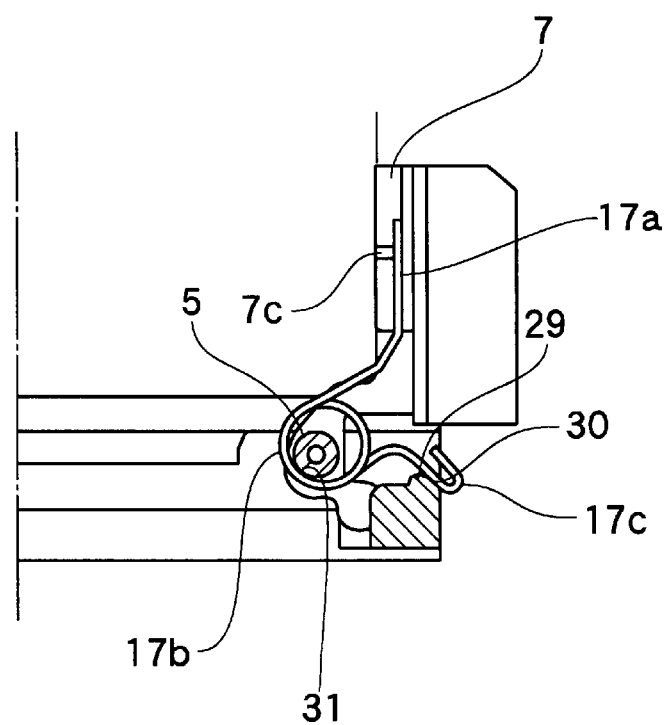
Figure 6:
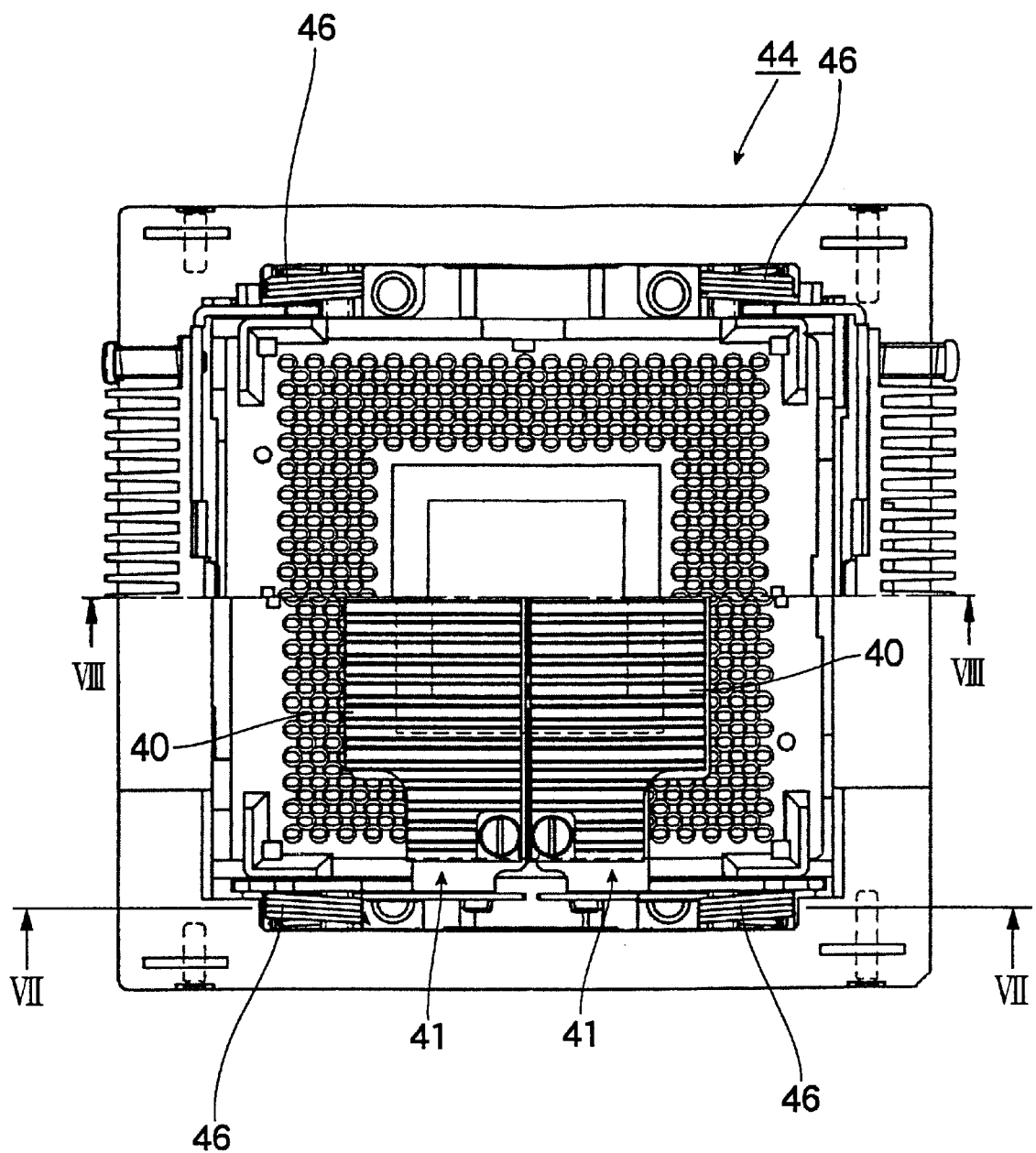
FIG. 6 is a plan view of an IC socket of related art, in which an upper half shows a state that an open/close member is opened and a lower half shows that the open/close member is closed.
Figure 7:
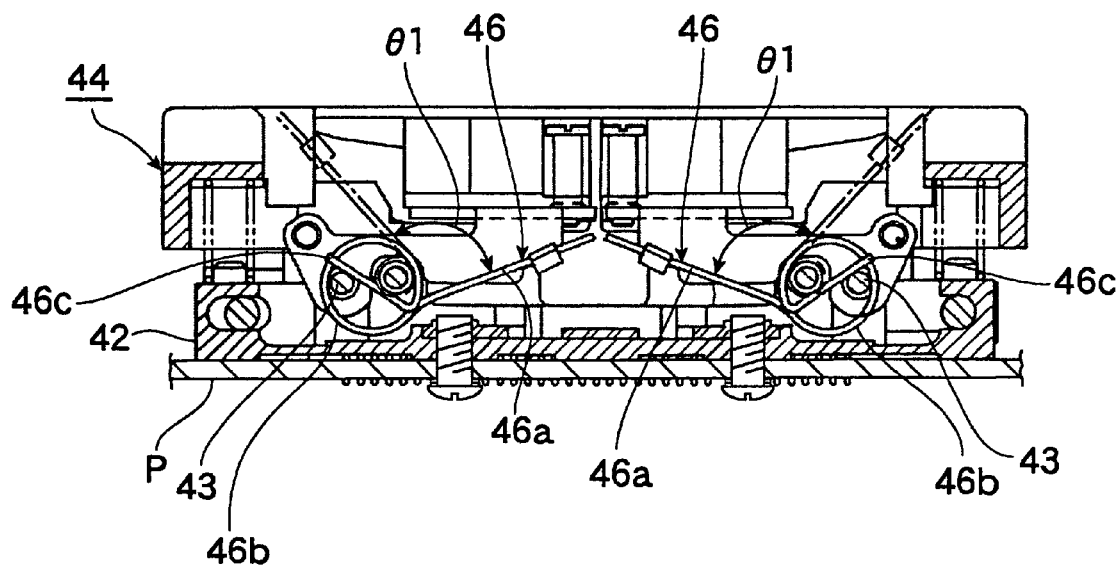
FIG. 7 is a sectional view taken along the line VII—VII in FIG. 6, showing the closed state of the open/close member.
Figure 8:
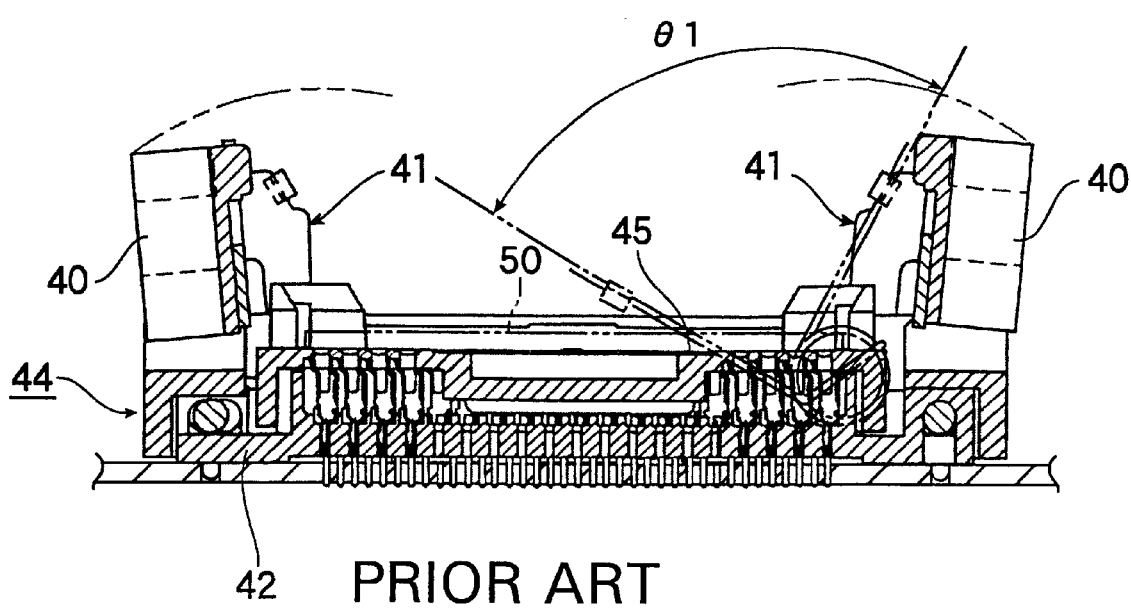
FIG. 8 is a sectional view taken along the line VIII—VIII of FIG. 6, showing the opened state of the open/close member.

Next, with reference to FIGS. 5A and 5B, when the operation member 18 is further lowered against the urging force of the auxiliary spring 28, the operating projections 18b of the operation member 18 depress the press portions 7a of the pivotal arms 7, which is then rotated about the rotational shafts 5 in the direction of opening the open/close members 4 formed integrally with the pivotal arms 7. In the full-opened state of the open/close members 4, the long-scaled rod-like portion 17a of the torsion coil spring 17 engaged with the engagement portion 7c of the front end of the pivotal arm 7 is rotated, i.e. deformed, by an angle of θ2 as shown in FIG. 2.

On the other hand, when the operation member 18 is lowered, as shown in FIG. 5B, the short-scaled rod-like portion 17c of the torsion coil spring 17 is disengaged from the engagement projection 29 and rotated by an angle of θ3 towards the escape surface 30.

Accordingly, the actual deformation amount of the torsion coil spring 17 is a value of ( θ2–θ3)(i.e., subtraction of the rotation angle θ3 of the short-scaled rod-like portion 17c from the apparent rotation angle θ2). That is, in the described embodiment of the present invention, the full-opened state of the open/close members 4 can be realized at a reduced rotating angle, i.e., reduced deformation amount, in comparison with a case that the coil ends of the torsion coil springs are fixed to the rotational shafts of the pivotal arms. Therefore, in a case where the same urging force is to be maintained, according to the present invention, the winding number of the coil portion 17b can be reduced and the average diameter thereof can be made small, thus improving the durability of the torsion coil spring 17.

Furthermore, according to the described embodiment, in the closed state of the open/close members 4, the short-scaled rod-like portions 17c of the torsion coil springs 17 are placed at positions in which the rod-like portions 17c ride on the engagement projections 29, and accordingly, a force for rotating the long-scaled rod-like portion 17a in the closing direction of the open/close member 4 with the contact portion 31 between the inner side portion of the portion 17b and the rotational shaft 5 being the fulcrum of this rotation. Thus, the pressing force for pressing the heat sink 9 against the body of the IC package 50 can be increased.

In the next process, when the setting of the IC package 50 to the socket body 50 has been completed, the depressing force to the operation member 18 is released, and then, the operation member 18 is urged upward by the urging force of the auxiliary spring 28. According to this motion, the pressing force to the press portion 7a of the pivotal arm 7 by the operation projection 18b is released, so that the open/close members 4 are rotated in their closed direction from the state shown in FIG. 3 by the urging force of the torsion coil springs 17.

Then, when the open/close members 4 are rotated by about 90 degrees from the full-opened state, the heat sink 9 abuts against the upper surface of the IC package 50. In this state, if the electrical performance test of the IC package 50 is carried out, the heat is radiated from the IC package 50 and the performance test of the IC package can be stably done.

Still furthermore, according to the present invention, since the auxiliary spring 28 is disposed between the socket body 2 and the operation member 18 so as to urge upward the operation member 18, this urging force is applied in addition to the urging force of the torsion coil spring 17 directly urging the open/close member 4 to its closing direction. Therefore, by adjusting the urging force of the auxiliary spring 28, the pressure for contacting the heat sink 9 to the IC package 50 can be adjusted, and hence, the heat radiation from the IC package 50 to the heat sink 9 can be further improved.

It is to be noted that the present invention is not limited to the described embodiment and many other changes and modifications may be made without departing from the scopes of the appended claims.

For example, although, in the described embodiment, the torsion coil springs 17 are disposed as urging means for directly urging the open/close members 4 in their closing direction, the present invention is not limited to such embodiment, and there may be adopted, for example, plate springs or other members each having one end engageable with the open/close member and other end engageable with the operation member.

What is claimed is:

1. A socket for an electrical part comprising:
   a socket body in which the electrical part is accommodated;
   a rotational shaft;
   an open/close member mounted to be rotatable about the rotational shaft, to the socket body;
   an urging member to urge the open/close member in a closed direction thereof, and
   an operation member vertically movable with respect to the socket body and in which the open/close member is opened against the urging of the urging member by depressing the operation member,
   wherein one end portion of the urging member is engaged with a portion of the open/close member apart from a rotation center thereof and another end portion of the urging member is engaged with the operation member, and
   when the another end portion of the urging member is moved downward with a downward movement of the operation member, the one end portion of the urging member is rotated in an opened direction of the open/close member.

2. A socket for an electrical part according to claim 1, wherein said urging member is a torsion coil spring having a coil portion, the one end portion extending from the coil portion and being engaged with said portion of the open/close member and the another end extending from the coil portion, said coil portion being wound up around the rotational shaft.

3. A socket for an electrical part according to claim 1, wherein said operation member is formed with an engagement portion with which said another end portion of the urging member is engaged and an escape portion, in which said another end portion is rotated according to a lowering motion of the operation member, if formed to the operation member outside said engagement portion.

4. A socket for an electrical part according to claim 1, wherein an auxiliary urging member for urging upward the operation member is disposed between the socket body and the operation member.

5. A socket for an electrical part according to claim 1, wherein said open/close member is provided with a heat sink radiating heat through contact to the electrical part.

6. A socket for an electrical part according to claim 5, wherein said heat sink is provided with an urging force adjusting device for urging the heat sink in a direction contacting to the electrical part.

7. A socket for an electrical part according to claim 6, wherein said urging force adjusting device includes a plurality of urging force adjusting members which are disposed apart from each other.

8. A socket for an electrical part comprising:
   a socket body to which an electrical part is accommodated;
   an open/close member mounted to the socket body to be rotatable about a rotational shaft;
   an urging member for urging the open/close member in a direction of closing the open/close member; and
   an operation member provided for the socket body to be vertically movable with respect to the socket body,
   said urging member having one end portion engaged with a portion of the open/close member apart from a rotation center thereof and another end portion engaged with the operation member, and when the another end portion of the urging member is moved downward with a downward movement of the operation member, the one end portion of the urging member is rotated in an opened direction of the open/close member.

9. A socket for an electrical part according to claim 8, wherein the engagement projection is round at a top portion thereof.

10. A socket for an electrical part according to claim 8, wherein a full-opened state of the open/close member is realized at a reduced rotating angle.

11. A socket for an electrical part according to claim 8, wherein the engaging member is a coil spring, the one end portion is a long-scaled rod-like portion and the another end portion is a short-scaled rod-like portion.

12. A socket for an electrical part according to claim 11, wherein the open/close member is comprised of a pair of opposing pivotal arms and the long-scaled rod-like portion engages with an engagement portion of the pivotal arms and the short-scaled rod-like portion engages with an engagement projection of the operation member.

13. A socket for an electrical part according to claim 12, wherein the engagement projection is formed to each of upper four corner portions of the operation member.

14. A socket for an electrical part comprising:
- a socket body in which the electrical part is accommodated;
- a rotational shaft;
- an open/close member mounted to the socket body and rotatable about the rotational shaft;
- an urging member to urge the open/close member in a closed direction thereof, and
- an operation member movable with respect to the socket body and in which the open/close member is opened against the urging of the urging member by depressing the operation member, wherein a first end portion of the urging member is moved in a direction of movement of the operation member, and a second end portion of the urging member is rotated in an opened direction of the open/close member.

* * * * *